(12) United States Patent
Lee et al.

(10) Patent No.: US 11,730,062 B2
(45) Date of Patent: Aug. 15, 2023

(54) ELECTRONIC DEVICE INCLUDING THERMAL STABILITY ENHANCED LAYER INCLUDING HOMOGENEOUS MATERIAL HAVING FE-O BOND

(71) Applicants: SK hynix Inc., Gyeonggi-do (KR); Kioxia Corporation, Tokyo (JP)

(72) Inventors: Tae Young Lee, Gyeonggi-do (KR); Guk Cheon Kim, Gyeonggi-do (KR); Soo Gil Kim, Gyeonggi-do (KR); Soo Man Seo, Gyeonggi-do (KR); Jong Koo Lim, Gyeonggi-do (KR); Taiga Isoda, Tokyo (JP)

(73) Assignees: SK hynix Inc., Gyeonggi-do (KR); Kioxia Corporation, Tokyo (JP)

( * ) Notice: Subject to any disclaimer, the term of this patent is extended or adjusted under 35 U.S.C. 154(b) by 390 days.

(21) Appl. No.: 17/032,938

(22) Filed: Sep. 25, 2020

(65) Prior Publication Data

US 2021/0184102 A1    Jun. 17, 2021

(30) Foreign Application Priority Data

Dec. 13, 2019    (KR) ........................ 10-2019-0166407

(51) Int. Cl.
*H10N 50/80*    (2023.01)
*G11C 11/16*    (2006.01)
*H10N 50/85*    (2023.01)

(52) U.S. Cl.
CPC ........... *H10N 50/80* (2023.02); *G11C 11/161* (2013.01); *H10N 50/85* (2023.02)

(58) Field of Classification Search
CPC ....... H01L 43/02; H01L 43/10; G11C 11/161; H10N 50/80
USPC .......................................................... 257/421
See application file for complete search history.

(56) References Cited

U.S. PATENT DOCUMENTS

| 8,138,561 | B2 | 3/2012 | Horng et al. |
| 10,079,338 | B2 | 9/2018 | Huai et al. |
| 10,214,817 | B2 * | 2/2019 | Takoudis ........... C23C 16/45553 |
| 2011/0294291 | A1 * | 12/2011 | Matsui .............. H01L 21/76883 |
| | | | 257/E21.585 |
| 2019/0295615 | A1 * | 9/2019 | Fukuzawa ............... H01L 43/08 |
| 2020/0326335 | A1 * | 10/2020 | Braganca .......... G01N 33/54346 |
| 2021/0184102 | A1 * | 6/2021 | Lee .......................... H01L 43/08 |

FOREIGN PATENT DOCUMENTS

| KR | 10-2010-0007884 | 1/2010 | |
| KR | 10-1708844 | 2/2017 | |
| WO | WO-2018164589 A1 * | 9/2018 | ............. B01D 53/62 |
| WO | WO-2018182644 A1 * | 10/2018 | |

* cited by examiner

*Primary Examiner* — Jami Valentine Miller
(74) *Attorney, Agent, or Firm* — IP & T Group LLP

(57) ABSTRACT

An electronic device may include a semiconductor memory, and the semiconductor memory may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and a thermal stability enhanced layer (TSEL) including a homogeneous material having an Fe—O bond.

17 Claims, 14 Drawing Sheets

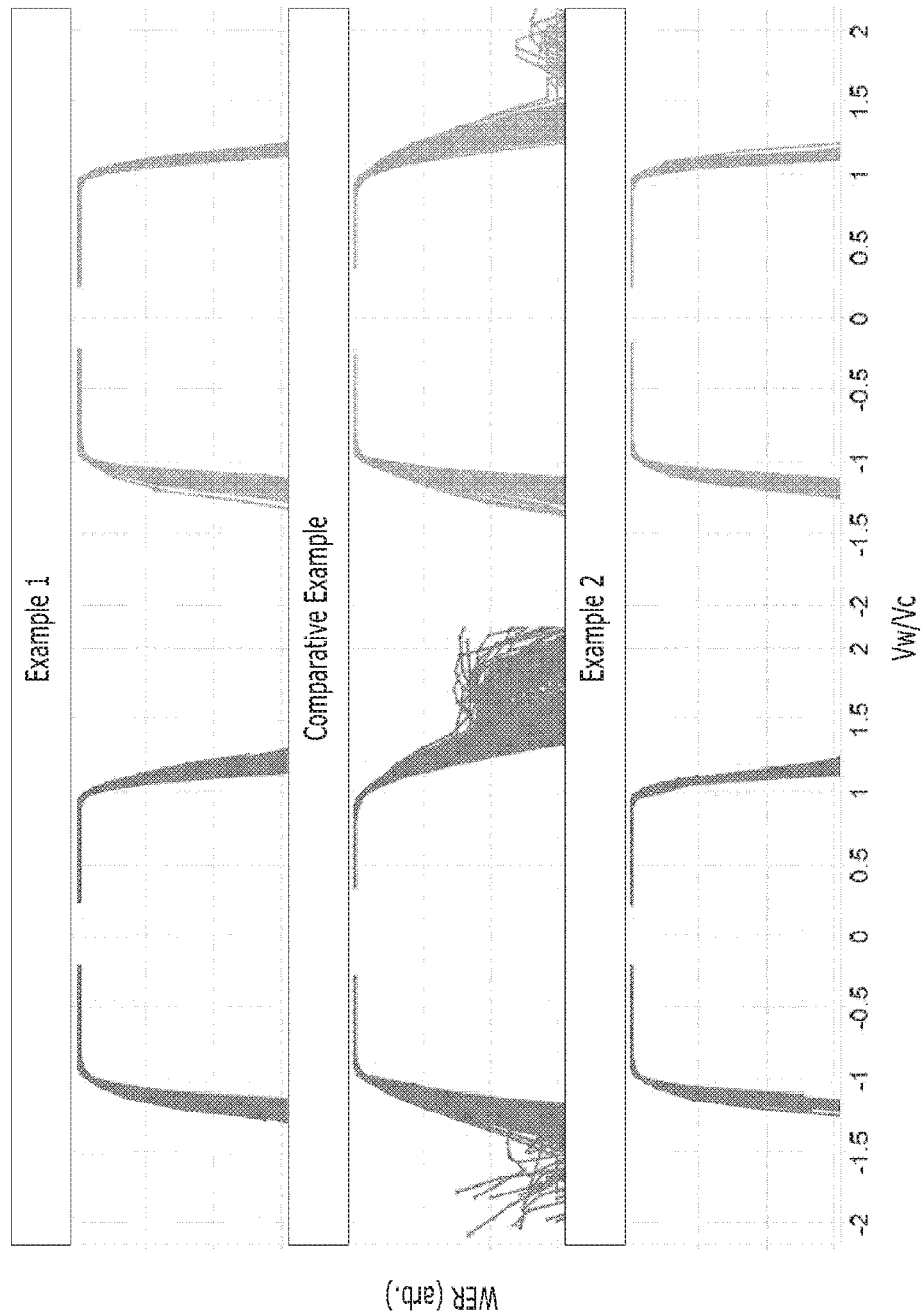

ELECTRONIC DEVICE INCLUDING THERMAL STABILITY ENHANCED LAYER INCLUDING HOMOGENEOUS MATERIAL HAVING FE-O BOND

CROSS-REFERENCE TO RELATED APPLICATION

This patent document claims priority to Korean Patent Application No. 10-2019-0166407, entitled "ELECTRONIC DEVICE" and filed on Dec. 13, 2019, which is incorporated herein by reference in its entirety.

TECHNICAL FIELD

This patent document relates to memory circuits or devices and their applications in electronic devices or systems.

BACKGROUND

Recently, as electronic devices or appliances trend toward miniaturization, low power consumption, high performance, multi-functionality, and so on, there is increased demand for electronic devices capable of storing information in various electronic devices or appliances such as a computer, a portable communication device, and the like. Extensive research and development for such electronic devices is being conducted. Examples of such electronic devices include electronic devices which can store data using a characteristic switched between different resistant states according to an applied voltage or current, and can be implemented in various configurations, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes memory circuits or devices, and their applications in electronic devices or systems. The disclosed technology in this patent document also includes various embodiments of an electronic device including a semiconductor memory which can improve the characteristics of a variable resistance element exhibiting different resistance states for storing data.

According to an aspect of the present invention, an electronic device is provided which includes a semiconductor memory. The semiconductor memory may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and a thermal stability enhanced layer (TSEL) including a homogeneous material having an Fe—O bond.

According to another aspect of the present invention, an electronic device is provided which includes a semiconductor memory, the semiconductor memory may include: a substrate; memory cells formed over the substrate, each memory cell including a magnetic layer and a thermal stability enhanced layer (TSEL) that is in contact with the magnetic layer; and switching elements formed over the substrate and coupled to the memory cells, respectively, to select or de-select the memory cells, wherein the TSEL may include a homogenous material having an Fe—O bond and structured to enhance a perpendicular magnetic anisotropy field.

According to further another aspect of the present invention, a semiconductor memory is provided. The semiconductor memory may include: a free layer having a variable magnetization direction, a pinned layer having a fixed magnetization direction, a tunnel barrier layer being interposed between the free layer and the pinned layer; and a thermal stability enhanced layer (TSEL) including a homogeneous material having an Fe—O bond.

These and other aspects, embodiments and associated advantages are described in greater detail in detailed description in conjunction with the drawings.

BRIEF DESCRIPTION OF THE DRAWINGS

FIG. 8 is a graph illustrating a WER as a function of a normalized Vw/Vc ratio of structures based on some embodiments of the disclosed technology and of a comparative example.

DETAILED DESCRIPTION

Figure 1:
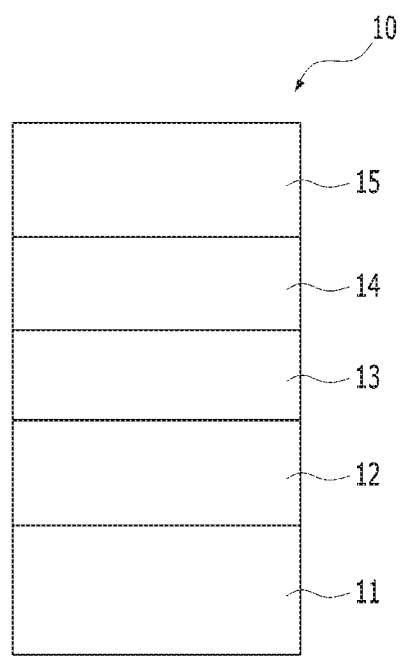
FIG. 1 is a cross-sectional view illustrating an example of a variable resistance element.

Various examples and embodiments of the disclosed technology are described below in detail with reference to the accompanying drawings.

The drawings may not be necessarily to scale and in some instances, proportions of at least some of substrates in the drawings may have been exaggerated to illustrate certain features of the described examples or embodiments of the invention. In presenting a specific example in a drawing or description having two or more layers in a multi-layer substrate, the relative positioning relationship of such layers or the sequence of arranging the layers as shown reflects a particular embodiment for the described or illustrated example and a different relative positioning relationship or sequence of arranging the layers may be possible.

It should be understood that the drawings are simplified schematic illustrations of the described devices and may not include well known details for avoiding obscuring the features of the invention.

It should also be noted that features present in one embodiment may be used with one or more features of another embodiment without departing from the scope of the invention.

FIG. 1 is a cross-sectional view illustrating an example of a variable resistance element 10.

Referring to FIG. 1, the variable resistance element 10 may include a Magnetic Tunnel Junction (MTJ) structure including a free layer 14 having a variable magnetization direction, a pinned layer 12 having a fixed magnetization direction and a tunnel barrier layer 13 interposed between the free layer 14 and the pinned layer 12.

The free layer 14 may have a variable magnetization direction that causes the MTJ structure to have a variable resistance value. The free layer 14 may also be referred as a storage layer.

The pinned layer 12 may have a pinned magnetization direction, which remains unchanged while the magnetization direction of the free layer 14 changes. For this reason, the pinned layer 12 may be referred to as a reference layer.

Depending on a voltage or current applied to the variable resistance element 10, the magnetization direction of the free layer 14 may be changed by spin torque transfer. When the magnetization directions of the free layer 14 and the pinned layer 12 are parallel to each other, the variable resistance element 10 may be in a low resistance state, and this may indicate a digital data bit "0." Conversely, when the magnetization directions of the free layer 14 and the pinned layer 12 are anti-parallel to each other, the variable resistance element 10 may be in a high resistance state, and this may indicate a digital data bit "1." That is, the variable resistance element 10 may function as a memory cell to store a digital data bit based on the orientation of the free layer 14.

The free layer 14 and the pinned layer 12 may each have a single-layer or a multilayer structure. The free layer 14 and the pinned layer 12 may each be or include a ferromagnetic material. The magnetization direction or polarity of the free layer 14 may be changed or flipped between a downward direction and an upward direction. The magnetization direction of the pinned layer 12 may be fixed in a downward direction.

The tunnel barrier layer 13 may allow the tunneling of electrons to change the magnetization direction of the free layer 14. The tunnel barrier layer 13 may include a dielectric oxide.

The variable resistance element 10 may further include one or more layers performing various functions to improve a characteristic of the MTJ structure. For example, the variable resistance element 10 may further include an under layer 11 disposed below the MTJ structure and an upper layer 15 disposed over the MTJ structure.

The upper layer 15 may include an oxide capping layer. Usually, MgO may be used as the oxide capping layer included in the upper layer 15.

In order to secure characteristics of the variable resistance element 10, the oxide capping layer should satisfy some requirements. That is, the oxide capping layer 1) should not increase a damping constant (a) of the free layer 14; 2) should not deteriorate an interface characteristic between the free layer 14 and the upper layer 15, and an interface characteristic between the free layer 14 and the tunnel barrier layer 13; 3) should not cause dispersion and deterioration of characteristics of the free layer 14 including a coercivity (Hc), a switching current (Ic) and a thermal stability ($\Delta$); and 4) should minimize a parasitic resistance (Rpara) of the oxide to improve a magnetoresistance (MR).

MgO which may be used as the oxide capping layer included in the upper layer 15 has an heterogenous amorphous structure and because of this, the oxide layer containing MgO may have a limit in maintaining a thermal stability ($\Delta$) when scaling down. Moreover, characteristics including a coercivity (Hc), a switching current (Ic) and a thermal stability ($\Delta$) and the degree of dispersion of such characteristics may be highly dependent on the oxide capping layer formed on the free layer 14. Therefore, the oxide capping layer such as MgO may deteriorate characteristics of the variable resistance element 10 including the MTJ structure.

A variable resistance element has a structure that exhibits different resistance states or values and is capable of being switched between different resistance states in response to an applied bias (e.g., a current or voltage). A resistance state of such a variable resistance element may be changed by applying a voltage or current of a sufficient magnitude (i.e., a threshold) in a data write operation. The different resistance states of different resistance values of the variable resistance element can be used for representing different data for data storage. Thus, the variable resistance element may store different data according to the resistance state. The variable resistance element may function as a memory cell. The memory cell may further include a selecting element coupled to the variable resistance element and controlling an access to the variable resistance element. Such memory cells may be arranged in various ways to form a semiconductor memory.

In some embodiments, the variable resistance element may be implemented to include a magnetic tunnel junction (MTJ) structure which includes a free layer having a variable magnetization direction, a pinned layer having a fixed magnetization direction, and a tunnel barrier layer interposed therebetween. In response to a voltage or current of a sufficient amplitude applied to the variable resistance element, the magnetization direction of the free layer may be changed to a direction parallel or antiparallel to the magnetization direction of the pinned layer. Thus, the variable resistance element may switch between a low-resistance state and a high-resistance state to store different data based on the different resistance states. The disclosed technology and its embodiments can be used to provide an improved variable resistance element capable of satisfying or enhancing various characteristics required for the variable resistance element. The variable resistance element according to the present disclosed invention may improve the thermal stability of the free layer and the dispersion of the device characteristics. The variable resistance element according to the present disclosed invention may provide improved scalability and write error rate (WER).

Figure 2:
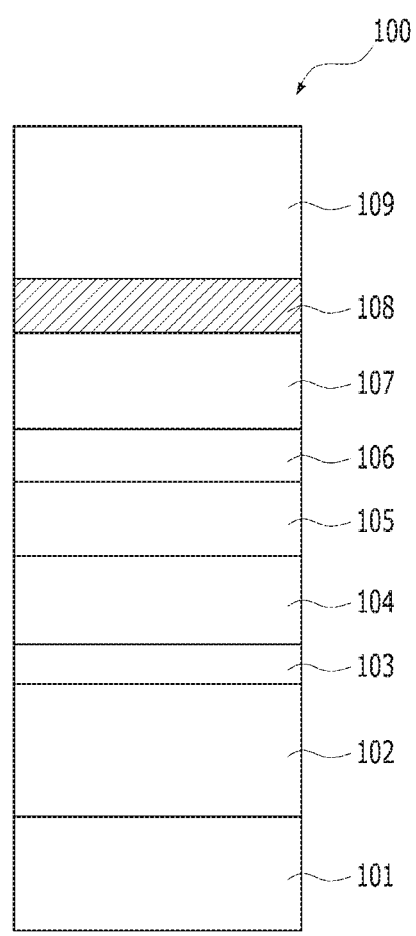
FIG. 2 is a cross-sectional view illustrating an example of a variable resistance element based on some embodiments of the disclosed technology.

FIG. 2 is a cross-sectional view illustrating an example of a variable resistance element 100 based on some embodiments of the disclosed technology.

Referring to FIG. 2, the variable resistance element 100 may include an MTJ structure including a free layer 107 having a variable magnetization direction, a pinned layer 104 having a pinned magnetization direction, and a tunnel barrier layer 106 interposed between the free layer 107 and the pinned layer 104.

The free layer 107 may have one of different magnetization directions or one of different spin directions of electrons to switch the polarity of the free layer 107 in the MTJ structure, resulting in changes in resistance value. In some embodiments, the polarity of the free layer 107 is changed or flipped upon application of a voltage or current signal (e.g., a driving current above a certain threshold) to the MTJ structure. With the polarity changes of the free layer 107, the free layer 107 and the pinned layer 104 have different magnetization directions or different spin directions of electron, which allows the variable resistance element 100 to store different data or represent different data bits. The free layer 107 may also be referred as a storage layer. The magnetization direction of the free layer 107 may be substantially perpendicular to a surface of the free layer 107, the tunnel barrier layer 106, and the pinned layer 104. In other words, the magnetization direction of the free layer 107 may be substantially parallel to the stacking direction of the free layer 107, the tunnel barrier layer 106, and the pinned layer 104. Therefore, the magnetization direction of the free layer 107 may be changed between a downward direction and an upward direction. The change in the magnetization direction of the free layer 107 may be induced by a spin transfer torque generated by an applied current or voltage.

The free layer 107 may have a single-layer or a multilayer structure. The free layer 107 may include a ferromagnetic material. For example, the free layer 107 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or the like, or may include a stack of metals, such as a stack of a cobalt layer and a platinum layer (Co/Pt stack), or a stack of a cobalt layer and a palladium layer (Co/Pd stack), or the like.

The tunnel barrier layer 106 may allow the tunneling of electrons in both data reading and data writing operations. In a write operation for storing new data, a high write current may be directed through the tunnel barrier layer 106 to change the magnetization direction of the free layer 107 and thus to change the resistance state of the MTJ for writing a new data bit. In a reading operation, a low reading current may be directed through the tunnel barrier layer 106 without changing the magnetization direction of the free layer 107 to measure the existing resistance state of the MTJ under the existing magnetization direction of the free layer 107 to read the stored data bit in the MTJ. The tunnel barrier layer 106 may include a dielectric oxide such as MgO, CaO, SrO, TiO, VO, or NbO or the like.

The pinned layer 104 may have a pinned magnetization direction, which remains unchanged while the magnetization direction of the free layer 107 changes. The pinned layer 104 may be referred to as a reference layer. In some embodiments, the magnetization direction of the pinned layer 104 may be pinned in a downward direction. In some embodiments, the magnetization direction of the pinned layer 104 may be pinned in an upward direction.

The pinned layer 104 may have a single-layer or a multilayer structure. The pinned layer 104 may include a ferromagnetic material. For example, the pinned layer 104 may include an alloy based on Fe, Ni or Co, for example, an Fe—Pt alloy, an Fe—Pd alloy, a Co—Pd alloy, a Co—Pt alloy, an Fe—Ni—Pt alloy, a Co—Fe—Pt alloy, a Co—Ni—Pt alloy, or a Co—Fe—B alloy, or may include a stack of metals, such as a stack of a cobalt layer and a platinum layer (Co/Pt stack), or a stack of a cobalt layer and a palladium layer (Co/Pd stack) or the like.

Moreover, the pinned layer 104 may form an antiferromagnetic exchange coupling with a shift canceling layer 102 through a spacer layer 103, which will be described as below.

If a voltage or current is applied to the variable resistance element 100, the magnetization direction of the free layer 107 may be changed by spin torque transfer. In some embodiments, when the magnetization directions of the free layer 107 and the pinned layer 104 are parallel to each other, the variable resistance element 100 may be in a low resistance state, and this may indicate digital data bit "0." Conversely, when the magnetization directions of the free layer 107 and the pinned layer 104 are anti-parallel to each other, the variable resistance element 100 may be in a high resistance state, and this may indicate a digital data bit "1." In some embodiments, the variable resistance element 100 can be configured to store data bit '1' when the magnetization directions of the free layer 107 and the pinned layer 104 are parallel to each other and to store data bit '0' when the magnetization directions of the free layer 107 and the pinned layer 104 are anti-parallel to each other.

In some embodiments, the variable resistance element 100 may further include at least one more layer performing various functions to improve a characteristic of the MTJ structure. For example, the variable resistance element 100 may further include at least one of a buffer layer 101, a shift canceling layer 102, a spacer layer 103, an intermediate layer 105, a thermal stability enhanced layer (TSEL) 108 and a capping layer 109.

The buffer layer 101 may be disposed below the shift canceling layer 102. The buffer layer 101 may be disposed immediately below the shift canceling layer 102. The buffer layer 101 may function as a buffer between the substrate and the layers disposed above the buffer layer 101. The buffer layer 101 may facilitate crystal growth of the layers disposed above the buffer layer 101 for improving the characteristics of the layers disposed above the buffer layer 101. The buffer layer 101 may have a single-layer or a multilayer structure. The buffer layer 101 may include a metal, a metal alloy, a metal nitride, or a metal oxide, or a combination thereof. Moreover, the buffer layer 101 may be formed of or include a material having a good compatibility with a bottom electrode (not shown) in order to resolve a lattice constant mismatch between the bottom electrode and the layers disposed above the buffer layer 101. For example, the buffer layer 101 may include tantalum (Ta).

The capping layer 109 may protect the variable resistance element 100 and function as a hard mask for patterning the variable resistance element 100. In some embodiments, the capping layer 109 may include various conductive materials such as a metal. In some embodiments, the capping layer 109 may include a metallic material having almost none or a small number of pin holes and high resistance to wet and/or dry etching. In some embodiments, the capping layer 109 may include a metal, a nitride or an oxide, or a combination thereof. For example, the capping layer 109 may include a noble metal such as ruthenium (Ru).

In some embodiments, the capping layer 109 may include a multilayer structure including a first metal layer and a second metal layer, which contain different metals from each other.

The shift canceling layer 102 may offset or reduce the effect of the stray magnetic field produced by the pinned layer 104, thus reducing a biased magnetic field in the free layer 107. The shift canceling layer 102 may cancel a magnetization inversion shift of the free layer 107 due to the stray field generated by the pinned layer 104. The shift canceling layer 102 may have a magnetization direction which is anti-parallel to the magnetization direction of the pinned layer 104. In an embodiment, when the pinned layer 104 has a downward magnetization direction, the shift canceling layer 102 may have an upward magnetization direction. Conversely, when the pinned layer 104 has an upward magnetization direction, the shift canceling layer 102 may have a downward magnetization direction. The shift canceling layer 102 may be exchange coupled with the pinned layer 104 via the spacer layer 103 to form a synthetic anti-ferromagnet (SAF) structure. The shift canceling layer 102 may have a single-layer or a multilayer structure. The shift canceling layer 102 may include a ferromagnetic material.

A material layer (not shown) for resolving the lattice structure differences and the lattice constant mismatch between the pinned layer 104 and the shift canceling layer 102 may be interposed between the pinned layer 104 and the shift canceling layer 102. For example, this material layer may be amorphous and may include a metal, a metal nitride, or metal oxide.

The spacer layer 103 may be interposed between the shift canceling layer 102 and the pinned layer 104. The spacer layer may function as a buffer between the shift canceling layer 102 and the pinned layer 104. The spacer layer 103 may implement an antiferromagnetic exchange coupling between the pinned layer 104 and the shift canceling layer 102. The spacer layer 103 may include a noble metal such as ruthenium (Ru).

The relative positions of the pinned layer 104 and the shift canceling layer 102 shown in FIG. 2 may be interchanged.

The intermediate layer 105 may be interposed between the tunnel barrier layer 106 and the pinned layer 104. The intermediate layer 105 may be a magnetic layer closest to the tunnel barrier layer 106. The intermediate layer 105 may have a body-centered cubic (bcc 001) structure to improve the magnetoresistance (MR).

In some embodiments, the intermediate layer 105 may include Co, Fe, Ni, B, other noble metals, or a combination thereof. In some embodiments the intermediate layer 105 may include a FeCoB alloy, meaning an alloy of Fe and Co containing boron. In an embodiment both the free layer and the intermediate layer may include a FeCoB alloy.

The thermal stability enhanced layer (TSEL) 108 may improve the characteristics of the free layer 107 and the degree of dispersion of such characteristics. For example, the TSEL 108 may increase the thermal stability and perpendicular anisotropy of the free layer 107. The TSEL 108 may improve an interface characteristic, secure the scalability, and improve the writing performance of the free layer 107. To this end, unlike the oxide capping layer containing MgO included in the upper layer 15 shown in FIG. 1, the TSEL 108 may include a homogenous material which has an increased number of Fe—O bonds.

In some embodiments, the TSEL 108 may include an alloy based on Fe, O and X, for example, an Fe—O—X alloy, wherein X may include Co, B, Mn, Cu, Al, Si, Ti, V, Cr, Ni, Ga, Ge, Zr, Nb, Mo, Pd, Ag, Hf, Ta, Ru, Pt, Rh, Ir, Mg, Sr, Ba, or a combination thereof.

In some embodiments, the Fe—O—X alloy included in the TSEL 108 may be an amorphous alloy.

In case of forming a homogeneous Fe—O—X alloy layer as the TSEL 108, the homogeneous Fe—O—X alloy layer may be formed through a physical deposition process by using an alloy target, for example, a sputtering process, and an oxidation process.

In another embodiment, after an Fe layer is deposited and a X layer is deposited over the Fe layer, an oxidation process may be performed on the resultant structure. Then, the homogeneous Fe—O—X layer may be formed by a reaction through a heat treatment. Here, a sequence of stacking the Fe layer and the X layer may be reversed.

In further another embodiment, after a plurality of Fe layers and a plurality of X layers are alternately deposited, an oxidation process may be performed on the resultant structure. Then, the homogeneous Fe—O—X layer may be formed through a heat treatment.

In still another embodiment, the homogeneous Fe—O—X layer may be formed through a physical deposition process by using an Fe target and an X target, for example, a co-sputtering process, followed by performing an oxidation process.

In still another embodiment, the homogeneous Fe—O—X layer may be formed by performing an oxidation process on the free layer 107 including Fe and X and performing a heat treatment on the resultant structure. That is, Fe and X of the Fe—O—X layer as the TSEL 108 may be derived from the material included in the free layer 107.

In another embodiments, the TSEL 108 may include an alloy based on Fe, O or X, for example, an Fe—Ir—O—X alloy, wherein X may include Co, B, Mn, Cu, Al, Si, Ti, V, Cr, Ni, Ga, Ge, Zr, Nb, Mo, Pd, Ag, Hf, Ta, Ru, Pt, Rh, Mg, Sr, Ba, or a combination thereof.

In some embodiments, the Fe—Ir—O—X alloy included in the TSEL 108 may be a crystalline alloy.

In case of forming a homogeneous Fe—Ir—O—X alloy layer as the TSEL 108, the homogeneous Fe—Ir—O—X alloy layer may be formed through a physical deposition process by using an alloy target, for example, a sputtering process, and an oxidation process.

In another embodiment, after an Fe layer is deposited, an Ir layer is deposited over the Fe layer and a X layer is deposited over the Ir layer, an oxidation process may be performed on the resultant structure. Then, the homogeneous Fe—Ir—O—X layer may be formed by a reaction through a heat treatment. Here, a sequence of stacking the Fe layer, the Ir layer and the X layer may be reversed.

In further another embodiment, after a plurality of Fe layers, a plurality of Ir layers and a plurality of X layers are alternately deposited, an oxidation process may be performed on the resultant structure. Then, the homogeneous Fe—Ir—O—X layer may be formed through a heat treatment.

In still another embodiment, the homogeneous Fe—Ir—O—X layer may be formed through a physical deposition process by using an Fe target, an Ir target and an X target, for example, a co-sputtering process, followed by performing an oxidation process.

In still another embodiment, the homogeneous Fe—Ir—O—X layer may be formed by forming an Ir layer over the free layer 107 including Fe and X, performing an oxidation process and performing a heat treatment on the resultant structure. That is, Fe and X of the Fe—Ir—O—X layer as the TSEL 108 may be derived from the material included in the free layer 107.

In still another embodiment, the homogeneous Fe—Ir—O—X layer may be formed by sputtering Ir over the free layer 107 including Fe and X together with oxidation, and then performing a heat treatment. That is, Fe and X of the Fe—Ir—O—X layer as the TSEL 108 may be derived from the material included in the free layer 107.

Since the Fe—O bonds in the variable resistance element 100 contribute to the perpendicular magnetic anisotropy field (Hk) of the free layer 107, it can be important to increase the number of Fe—O bonds to improve the perpendicular magnetic anisotropy field (Hk). In accordance with the embodiment, the TSEL 108 can contribute to the perpendicular magnetic anisotropy field (Hk) by including a homogenous material having an increased number of Fe—O bond. Further, the TSEL 108 can increase the number of Fe—O bonds in the variable resistance element 100, for example, at an interface of the free layer 107 and the TSEL 108. Therefore, it is possible to enhance the thermal stability (Δ) and the perpendicular magnetic anisotropy field (Hk) of the free layer 107, and improve characteristics of the free layer 107 such as the coercivity (Hc), the switching current (Ic) and the thermal stability (Δ), and the degree of dispersion of such characteristics. Further, the interface characteristic between the TSEL 108 and the free layer 107 and the interface characteristic between the free layer 107 and the tunnel barrier layer 106 can be improved, thereby improving the WER and the writing performance. Moreover, since a sufficient thermal stability can be exhibited when scaling down, an overall thickness of the variable resistance element 100 can be reduced, thereby securing scalability.

In some embodiments, the magnetic layer which is closest to the tunnel barrier layer 106 among the magnetic layers included in the variable resistance element 100 may have a bcc (001) structure to improve the MR.

In FIG. 2, the free layer 107 may be formed above the pinned layer 104. In another embodiment, the free layer 107 may be formed under the pinned layer 104. This will be described with reference to FIG. 3.

Figure 3:
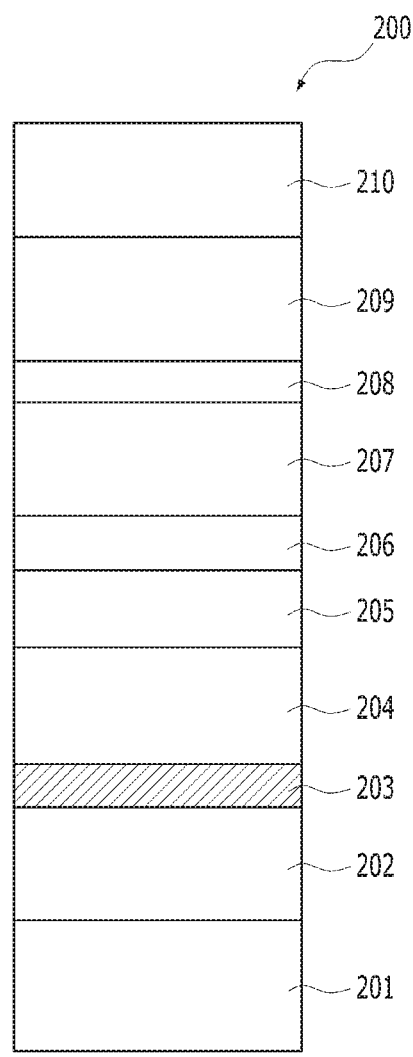
FIG. 3 is a cross-sectional view illustrating another example of a variable resistance element based on some embodiments of the disclosed technology.

FIG. 3 is a cross-sectional view illustrating another example of a variable resistance element based on some embodiments of the disclosed technology. The description will be focused on features different from those discussed with respect to FIG. 2.

Referring to FIG. 3, a variable resistance element 200 in accordance with an embodiment may include a buffer layer 201, an under layer 202, a thermal stability enhanced layer (TSEL) 203, a free layer 204, a tunnel barrier layer 205, an intermediate layer 206, a pinned layer 207, a spacer layer 208, a shift canceling layer 209 and a capping layer 210. There is a difference between the variable resistance element 200 shown in FIG. 3 and the variable resistance element 100 shown in FIG. 2 in that in the variable resistance element 200 shown in FIG. 3, the pinned layer 207 is located above the free layer 204 and the TSEL 203 is located below the free layer 204. That is, in the variable resistance element 200, the pinned layer 207 formed above the free layer 204 may be antiferromagnetically exchange coupled with the shift canceling layer 209 through the spacer layer 208 to form an SAF structure, and the TSEL 203 may be formed below the free layer 204.

The under layer 202 may improve the perpendicular magnetic anisotropy of the free layer 204. The under layer 202 may have a single-layer or a multilayer structure. The under layer 202 may include a metal, a metal alloy, a metal nitride, a metal oxide, or a combination thereof.

The descriptions for the buffer layer 201, the free layer 204, the tunnel barrier layer 205, the intermediate layer 206, the pinned layer 207, the spacer layer 208, the shift canceling layer 209 and the capping layer 210 are not repeated because they are substantially similar to those of the embodiment shown in FIG. 2.

In this embodiment, the TSEL 203 may be disposed below the free layer 204. The over layer 15 shown in FIG. 1 may include a heterogeneous amorphous material such as MgO, while the TSEL 203 may include a homogeneous material having an increased number of Fe—O bonds.

In some embodiments, the TSEL 203 may include an alloy based on Fe, O or X, for example, an Fe—O—X alloy, wherein X may include Co, B, Mn, Cu, Al, Si, Ti, V, Cr, Ni, Ga, Ge, Zr, Nb, Mo, Pd, Ag, Hf, Ta, Ru, Pt, Rh, Ir, Mg, Sr, Ba, or a combination thereof. The Fe—O—X alloy included in the TSEL 203 may be an amorphous alloy.

In case of forming a homogeneous Fe—O—X alloy layer as the TSEL 203, the homogeneous Fe—O—X alloy layer may be formed through a physical deposition process by using an alloy target, for example, a sputtering process, and an oxidation process.

In another embodiment, after an Fe layer is deposited and a X layer is deposited over the Fe layer, an oxidation process may be performed on the resultant structure. Then, the homogeneous Fe—O—X layer may be formed by a reaction through a heat treatment. Here, a sequence of stacking the Fe layer and the X layer may be reversed.

In further another embodiment, after a plurality of Fe layers and a plurality of X layers are alternately deposited, an oxidation process may be performed on the resultant structure. Then, the homogeneous Fe—O—X layer may be formed through a heat treatment.

In still another embodiment, the homogeneous Fe—O—X layer may be formed through a physical deposition process by using an Fe target and an X target, for example, a co-sputtering process, followed by performing an oxidation process.

In another embodiment, the TSEL 203 may include an alloy based on Fe, O or X, for example, an Fe—Ir—O—X alloy, wherein X may include Co, B, Mn, Cu, Al, Si, Ti, V, Cr, Ni, Ga, Ge, Zr, Nb, Mo, Pd, Ag, Hf, Ta, Ru, Pt, Rh, Mg, Sr, Ba, or a combination thereof. The Fe—Ir—O—X alloy included in the TSEL 203 may be a crystalline alloy.

In case of forming a homogeneous Fe—Ir—O—X alloy layer as the TSEL 203, the homogeneous Fe—Ir—O—X alloy layer may be formed through a physical deposition process by using an alloy target, for example, a sputtering process, and an oxidation process.

In another embodiment, after an Fe layer is deposited, an Ir layer is deposited over the Fe layer and a X layer is deposited over the Ir layer, an oxidation process may be performed on the resultant structure. Then, the homogeneous Fe—Ir—O—X layer may be formed by a reaction through a heat treatment. Here, a sequence of stacking the Fe layer, the Ir layer and the X layer may be reversed.

In further another embodiment, after a plurality of Fe layers, a plurality of Ir layers and a plurality of X layers are alternately deposited, an oxidation process may be performed on the resultant structure. Then, the homogeneous Fe—Ir—O—X layer may be formed through a heat treatment.

In still another embodiment, the homogeneous Fe—Ir—O—X layer may be formed through a physical deposition process by using an Fe target, an Ir target and an X target, for example, a co-sputtering process, followed by performing an oxidation process.

Since the Fe—O bonds in the variable resistance element 200 contribute to the perpendicular magnetic anisotropy field (Hk) of the free layer 204, it can be important to increase the number of Fe—O bonds to improve the perpendicular magnetic anisotropy field (Hk). In accordance with the embodiment, the TSEL 203 can contribute to the perpendicular magnetic anisotropy field (Hk) by including a homogenous material having an increased number of Fe—O bond. Further, the TSEL 203 can increase the number of Fe—O bonds in the variable resistance element 200, for example, at an interface of the free layer 204 and the TSEL 203. Therefore, it is possible to enhance the thermal stability (Δ) and the perpendicular magnetic anisotropy field (Hk) of the free layer 204, and also improve the characteristics of the free layer 204 such as the coercivity (Hc), the switching current (Ic) and the thermal stability (Δ), and the degree of dispersion of such characteristics. Further, the interface characteristic between the TSEL 203 and the free layer 204 and the interface characteristic between the TSEL 203 and the tunnel barrier layer 205 can be improved, thereby improving the WER and the writing performance. Moreover, since a sufficient thermal stability can be exhibited when scaling down, an overall thickness of the variable resistance element 200 can be reduced, thereby securing scalability of the device.

In some embodiments, the magnetic layer which is closest to the tunnel barrier layer 205 among the magnetic layers included in the variable resistance element 200 may have a bcc (001) structure to improve the MR.

The effects in accordance with the embodiment will be described in detail with reference to FIGS. 4 to 8.

Figure 4:
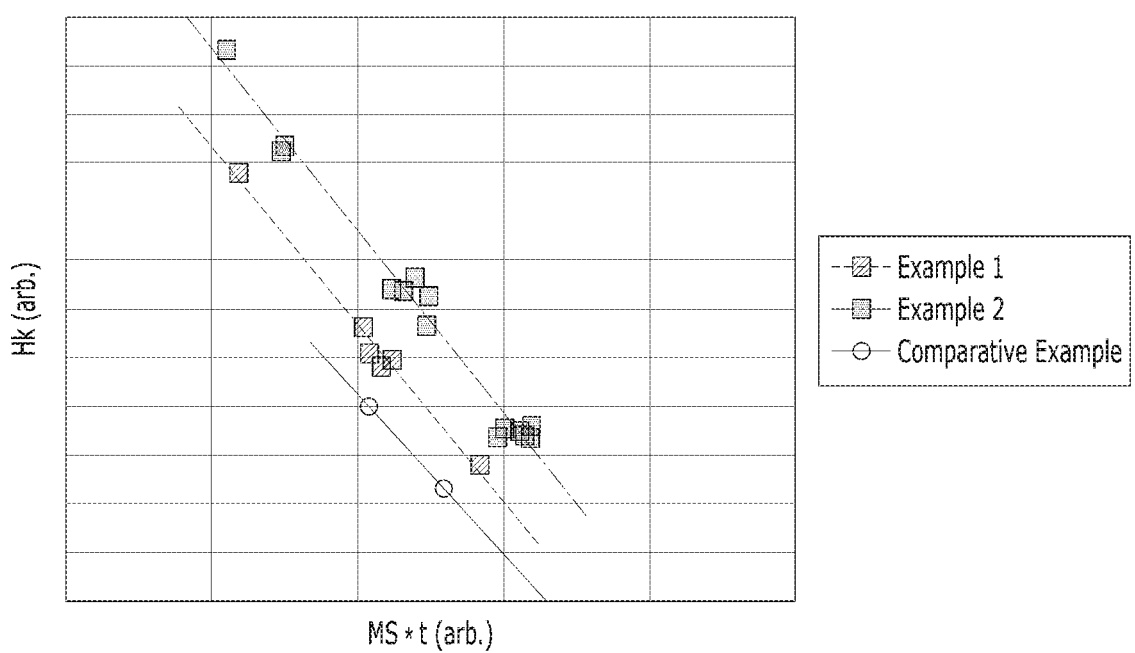
FIG. 4 is a graph illustrating a perpendicular magnetic anisotropy field (Hk) as a function of a Ms*t value of structures based on embodiments of the disclosed technology and of a comparative example.

FIG. 4 is a graph illustrating a perpendicular magnetic anisotropy field (Hk) as a function of a Ms*t value of structures based on embodiments of the disclosed technology and of a comparative example.

In FIG. 4, Ms represents saturation magnetization and t represents a thickness of the free layer. Example 1 represents the variable resistance element 100 shown in FIG. 2 wherein the TSEL 108 includes FeOX (X includes Co or CoB). Example 2 represents the variable resistance element 100 shown in FIG. 2 wherein the TSEL 108 includes FeIrOX (X includes Co or CoB) and the Comparative Example represents the variable resistance element which includes the common MgO capping layer instead of including the TSEL 108 such as that in the variable resistance element 100.

As shown in FIG. 4, Examples 1 and 2 including TSEL 108 containing FeOX or FeIrOX exhibit a remarkably improved perpendicular magnetic anisotropy field (Hk) compared with the Comparative Example including the MgO capping layer. The perpendicular magnetic anisotropy field (Hk) can be improved through the increased number of Fe—O bonds by using the TSEL 108 including FeOX or FeIrOX. Therefore, in accordance with the embodiment, the thermal stability of the free layer can be significantly improved. For reference, the thermal stability may be expressed by the equation (1):

$$\Delta = \frac{Ms * t * S * Hk}{2k_B T} \qquad \text{[Equation 1]}$$

wherein, S indicates an area of the free layer, $k_B$ indicates Boltzmann constant and T indicates a temperature.

With reference to equation (1), since the thermal stability is proportional to the Hk value of the free layer, if the Hk value is increased, the thermal stability is also increased.

Figure 5:
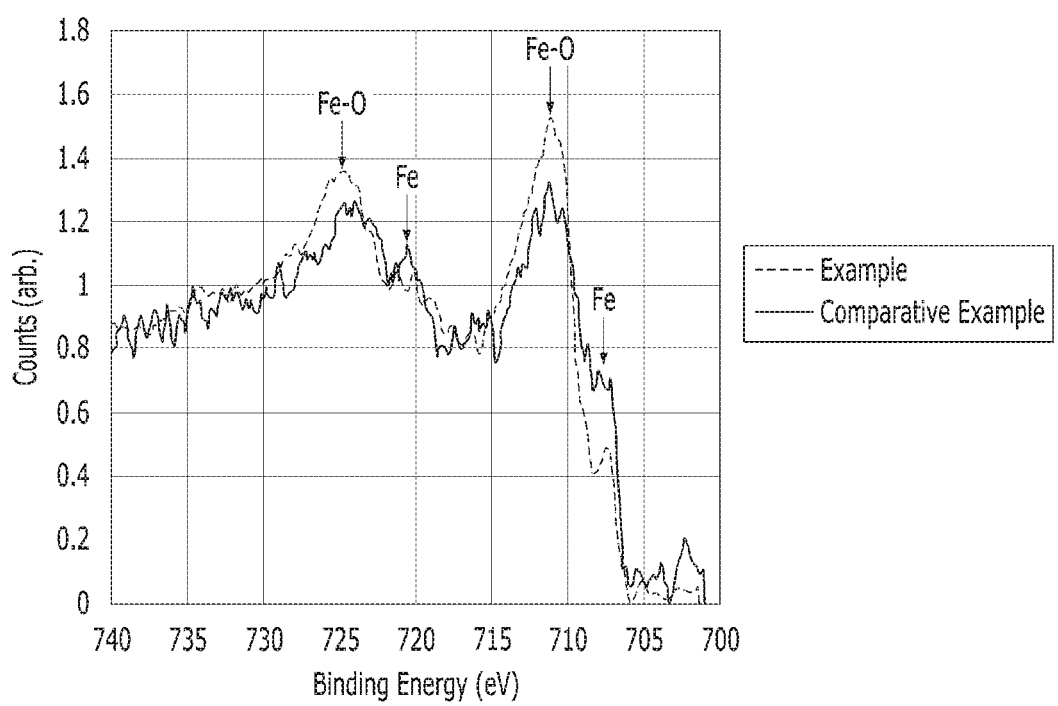
FIG. 5 is a graph illustrating an X-ray photoelectron spectroscopy (XPS) of structures based on some embodiments of the disclosed technology and of a comparative example.

FIG. 5 is a graph illustrating an X-ray photoelectron spectroscopy (XPS) of structures based on some embodiments of the disclosed technology and of a comparative example.

In FIG. 5, Example represents the variable resistance element 100 shown in FIG. 2 wherein the TSEL 108 includes FeOX (X includes Co or CoB) and Comparative Example represents the variable resistance element which includes the common MgO capping layer instead of including the TSEL 108 such as that in the variable resistance element 100.

As shown in FIG. 5, in accordance with Example including the TSEL 108 containing FeOX, the number of the Fe—O bonds are increased in comparison with the Comparative Example. As such, by using the TSEL 108 containing FeOX, the thermal stability and the perpendicular magnetic anisotropy field are improved so that a sufficient thermal stability can be secured when scaling down.

Figure 6A:
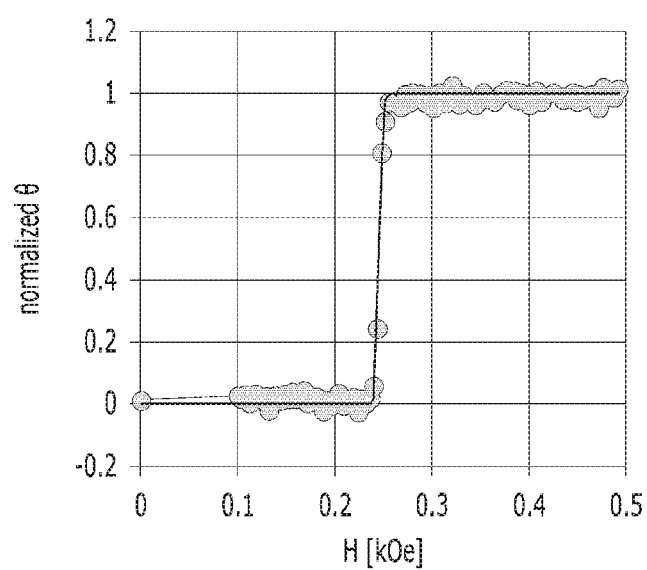
FIGS. 6A and 6B are graphs illustrating a normalized Kerr rotation angle as a function of an applied magnetic field of structures based on some embodiments of the disclosed technology and of a comparative example.
Figure 6B:
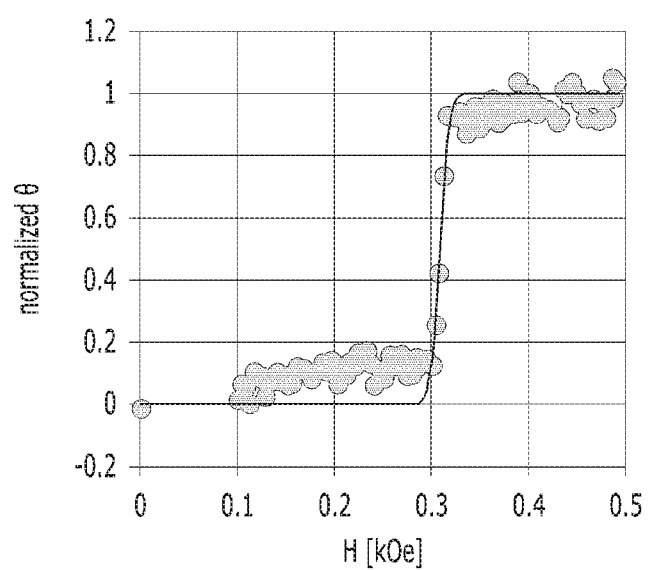

FIG. 6A and FIG. 6B are graphs illustrating a normalized Kerr rotation angle as a function of an applied magnetic field of structures based on some embodiments of the disclosed technology and of a comparative example, respectively.

In FIG. 6A and FIG. 6B, the horizontal axis represents the applied magnetic field (kOe), the vertical axis represents the normalized Kerr rotation angle (θ) and σHk represents a standard deviation. The Kerr rotation angle (θ) may be a value indicating the magnitude of the rotation angle when the polarization angle of light is reflected from the optically active magnetic medium. The Kerr rotation angle (θ) may be proportional to the magnetization (M). In FIG. 6A represents Example and FIG. 6B represents Comparative Example, wherein Example represents the variable resistance element 100 shown in FIG. 2 wherein the TSEL 108 includes FeOX (X includes Co or CoB) and Comparative Example represents the variable resistance element which includes the common MgO capping layer instead of including the TSEL 108 such as that in the variable resistance element 100.

As shown in FIGS. 6A and 6B, in accordance with Example including the TSEL 108 containing FeOX, the free layer exhibits a superior magnetization reversal property and has a smaller standard deviation of the perpendicular magnetic anisotropy field compared with Comparative Example including the MgO capping layer.

Figure 7:
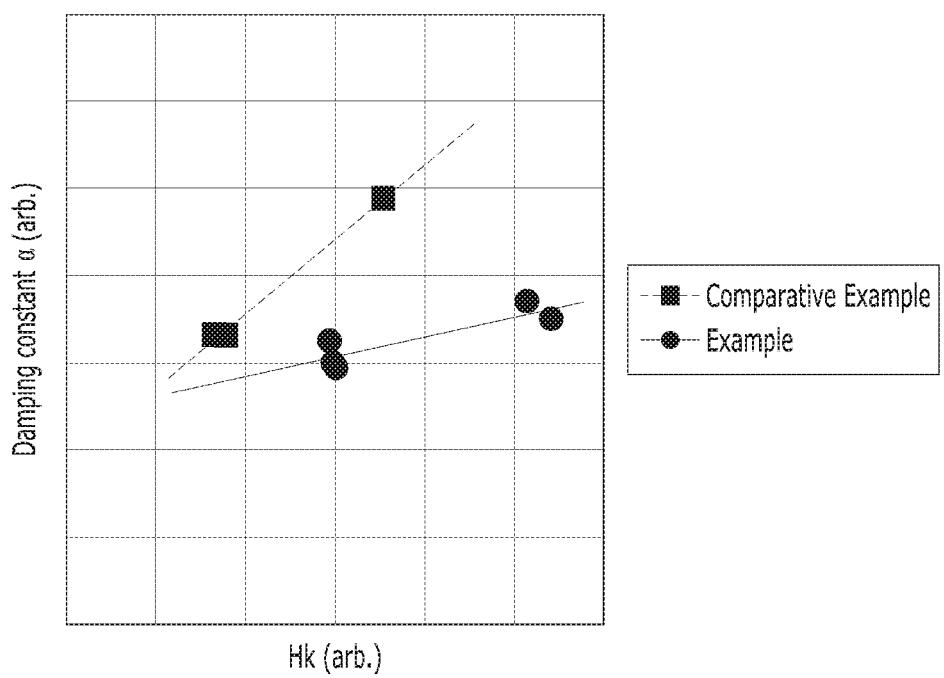
FIG. 7 is a graph illustrating the damping constant as a function of the perpendicular magnetic anisotropy field (Hk) of structures based on some embodiments of the disclosed technology and of a comparative example.

FIG. 7 is a graph illustrating the damping constant as a function of the perpendicular magnetic anisotropy field (Hk) of structures based on some embodiments of the disclosed technology and of a comparative example.

In FIG. 7, the horizontal axis represents the perpendicular magnetic anisotropy field (Hk) of the free layer and the vertical axis represents the damping constant of the free layer. Example represents the variable resistance element 100 shown in FIG. 2 wherein the TSEL 108 includes FeOX (X includes Co or CoB) and Comparative Example represents the variable resistance element which includes the common MgO capping layer instead of including the TSEL 108 such as that in the variable resistance element 100.

As shown in FIG. 7, in accordance with Example including the TSEL 108 containing FeOX, the damping constant can be remarkably reduced and the perpendicular magnetic anisotropy field can be improved compared with Comparative Example.

FIG. 8 is a graph illustrating a WER as a function of a normalized Vw/Vc ratio of structures based on some embodiments of the disclosed technology and of a comparative example.

In FIG. 8, the horizontal axis represents the normalized Vw/Vc value and the vertical axis represents the WER. The Vw represents a write voltage, the Vc represents a critical voltage and the WER represents a write error rate. Example 1 represents the variable resistance element 100 shown in FIG. 2 wherein the TSEL 108 includes FeOX (X includes Co or CoB), Example 2 represents the variable resistance element 100 shown in FIG. 2 wherein the TSEL 108 includes FeIrOX (X includes Co or CoB) and Comparative Example represents the variable resistance element which includes the common MgO capping layer instead of including the TSEL 108 such as that in the variable resistance element 100.

As shown in FIG. 8, Examples 1 and 2 including TSEL 108 containing FeOX or FeIrOX exhibit a remarkably improved WER and the writing performance compared with Comparative Example including the MgO capping layer.

Through the results shown in FIGS. 4 to 8, the variable resistance element having significantly improved characteristics can be implemented by using the TSEL including a homogenous material having an increased number of Fe—O bonds, compared with Comparative Example including the heterogeneous amorphous MgO. That is, in accordance with an embodiment, it is possible to enhance the thermal stability ($\Delta$) and the perpendicular magnetic anisotropy field (Hk) of the free layer, and improve characteristics of the free layer such as the coercivity (Hc), the switching current (Ic) and the thermal stability ($\Delta$), and the degree of dispersion of such characteristics. Further, the interface characteristics can be improved, thereby improving the WER and the writing performance. Moreover, since a sufficient thermal stability can be exhibited when scaling down, an overall thickness of the variable resistance element can be reduced, thereby securing a scalability.

The variable resistance element 200 shown in FIG. 3 may have the same effect as the variable resistance element 100 shown in FIG. 2.

Figure 9A:
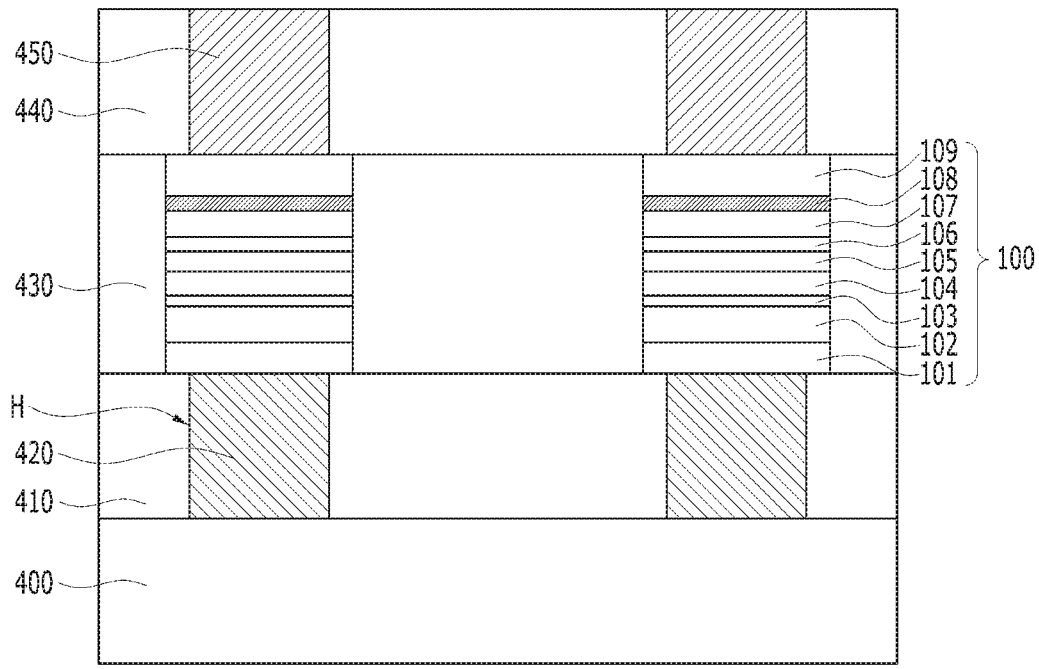
FIG. 9A is a cross-sectional view illustrating an example of a memory device and an example method for fabricating the memory device based on some embodiments of the disclosed technology.
Figure 9B:
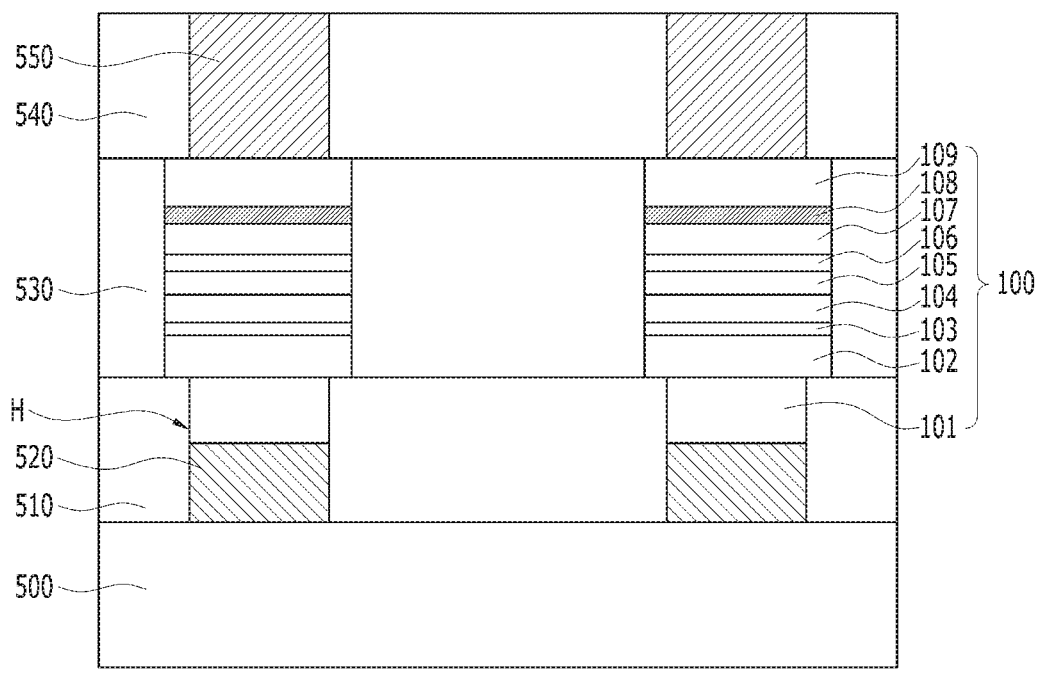
FIG. 9B is a cross-sectional view illustrating another example of the memory device and a method for fabricating the memory device based on some embodiments of the disclosed technology.

A semiconductor memory device as disclosed in this document may include a cell array of variable resistance elements 100 and 200. The semiconductor memory may further include various components such as lines, elements, etc. to drive or control each of the variable resistance elements 100 and 200. An example of this is described with reference to FIGS. 9A and 9B. In FIGS. 9A and 9B, the variable resistance element 100 of FIG. 2 is employed, however, it should be understood that the variable resistance element 200 of FIG. 3 may also be used instead for the variable resistance element 100.

FIG. 9A is a cross-sectional view of a memory device of an example based on some embodiments of the disclosed technology.

Referring to FIG. 9A, a memory device according to an embodiment may include a substrate 400, lower contacts 420 formed over the substrate 400, corresponding variable resistance elements 100 each formed over a respective one of the lower contacts 420 and upper contacts 450 each formed over a corresponding variable resistance element 100. For each variable resistance element 100, a specific structure such as a switch or switching circuit/element, for example, a transistor, for controlling an access to a particular variable resistance element 100 may be provided over the substrate 400 to control the variable resistance element 100, where the switch can be turned on to select the variable resistance element 100 or turned off to de-select the variable resistance element 100. Each lower contact 420 may be disposed over the substrate 400, and couple a lower end of a corresponding variable resistance element 100 to a respective portion of the substrate 400, for example, a drain of the transistor as the switching circuit for the variable resistance element 100. Each upper contact 450 may be disposed over a corresponding variable resistance element 100, and couple an upper end of the variable resistance element 100 to a certain line (not shown), for example, a bit line. In FIG. 9A, two variable resistance elements 100 are shown as examples of the elements in an array of variable resistance elements 100 but the number of the variable resistance elements 100 may differ.

A method for making the device may include providing the substrate 400 in which the transistor is formed. Then, a first interlayer dielectric layer 410 may be formed over the substrate 400. The lower contacts 420 may be formed by selectively etching the first interlayer dielectric layer 410 to form a plurality of spaced apart holes H, each hole penetrating through the first interlayer dielectric layer 410 to expose a corresponding portion of the substrate 400. The holes H may be filled with a conductive material. Then, the variable resistance elements 100 may be formed by forming material layers for the variable resistance elements 100 over the first interlayer dielectric layer 410 and the lower contacts 420. The material layers may be selectively etched to form the plurality of the variable resistance elements 100. Each of the variable resistance elements 100 may be positioned above a corresponding lower contact 420. The etch process for forming the variable resistance element 100 may include the ion beam etching (IBE) method which has a strong physical etching characteristic. Then, a second interlayer dielectric layer 430 may be formed to cover the space between the variable resistance elements 100 over the first dielectric layer 410. Then, a third interlayer dielectric layer 440 may be formed over the variable resistance element 100 and the second interlayer dielectric layer 430, and then upper contacts 450 passing through the third interlayer dielectric layer 440 and coupled to an upper end of corresponding variable resistance elements 100 may be formed using similar process steps as describe above for the formation of the lower contacts 420.

In the memory device of FIG. 9A, all layers forming the variable resistance element 100 may have sidewalls which are aligned with one another. That is because the variable resistance element 100 is formed through an etch process using a single mask.

Unlike the embodiment of FIG. 9A, a part of each of the variable resistance elements 100 may be patterned separately from other parts. This process is illustrated in FIG. 9B.

FIG. 9B is a cross-sectional view for describing a memory device and a method for fabricating the memory device based on another embodiment of the present disclosure. The following descriptions will be focused on features which differ from those of FIG. 9A.

Referring to FIG. 9B, the memory device according to an embodiment may include a variable resistance element 100 of which a part, for example, a buffer layer 101 has sidewalls that are not aligned with the sidewalls of the other layers of the variable resistance element 100. As shown in FIG. 9B, the buffer layer 101 may have sidewalls which are aligned with the sidewalls of the lower contacts 520.

The memory device in FIG. 9B may be fabricated by the following processes.

First, a first interlayer dielectric layer 510 may be formed over a substrate 500, and then selectively etched to form a plurality of holes H passing through the first interlayer dielectric layer 510 to expose corresponding portions of the substrate 500. Then, the lower contacts 520 may be formed by filling only a lower portion of the holes H. For example, the lower contacts 520 may be formed through a series of processes of forming a conductive material to cover the resultant structure having the holes formed therein, and removing a part of the conductive material through an etch back process until the conductive material has a desired thickness. Then, the buffer layer 101 may be formed to fill the remaining portion of each of the holes H. For example, the buffer layer 101 may be formed by forming a material layer for forming the buffer layer 101 which covers the resultant structure in which the lower contacts 520 are formed, and then performing a planarization process such as a CMP (Chemical Mechanical Planarization) until a top surface of the first interlayer dielectric layer 510 is exposed. Then, the remaining parts of the variable resistance element 100 may be formed by forming material layers for forming the remaining layers of the variable resistance element 100 except the buffer layer 101 over the lower contacts 520 and the first interlayer dielectric layer 510.

Subsequent processes are substantially the same as those as shown in FIG. 9A.

In this embodiment, the height which needs to be etched at a time in order to form the variable resistance element 100 can be reduced, which lowers the difficulty level of the etch process.

Although in this embodiment, the buffer layer 101 of the variable resistance elements 100 is buried in the corresponding holes H, other parts of the variable resistance elements 100 may also be buried as needed.

The above and other memory circuits or semiconductor devices based on the disclosed technology can be used in a range of devices or systems. FIGS. 10 to 14 provide some examples of devices or systems implementing the memory circuits disclosed herein.

Figure 10:
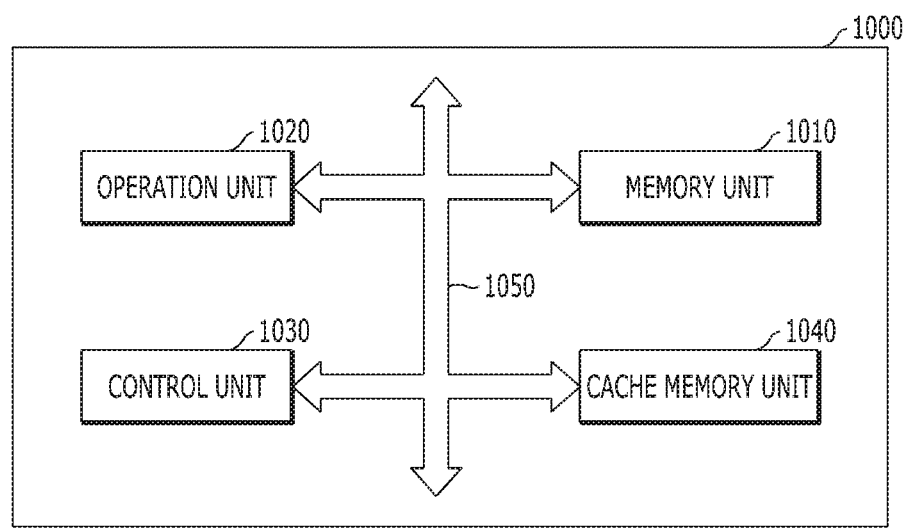
FIG. 10 is an example configuration diagram of a microprocessor including memory circuitry based on an embodiment of the disclosed technology.

FIG. 10 is an example configuration diagram of a microprocessor 1000 including memory circuitry based on the disclosed technology.

Referring to FIG. 10, the microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and a cache memory unit 1040. The microprocessor 1000 may be various data processing circuits such as a central processing unit (CPU), a graphic processing unit (GPU), a digital signal processor (DSP) and an application processor (AP).

The memory unit 1010 is a part which stores data in the microprocessor 1000, such as a processor register. The memory unit 1010 may include a data register, an address register, a floating point register and the like. Additionally, the memory unit 1010 may include various registers. The memory unit 1010 may perform the function of temporarily storing data for which operations are to be performed by the operation unit 1020, result data from performing the operations and addresses where data for performing of the operations are stored.

The memory unit 1010 may include one or more of the above-described semiconductor devices. For example, the memory unit 1010 may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and a thermal stability enhanced layer (TSEL) including a homogeneous material having an Fe—O bond. Through this, data storage characteristics of the memory unit 1010 may be improved. As a consequence, operating characteristics of the microprocessor 1000 may be improved.

The operation unit 1020 may perform four arithmetical operations or logical operations according to results from the control unit 1030 decoding commands. The operation unit 1020 may include at least one arithmetic logic unit (ALU).

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The cache memory unit 1040 may temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 11:
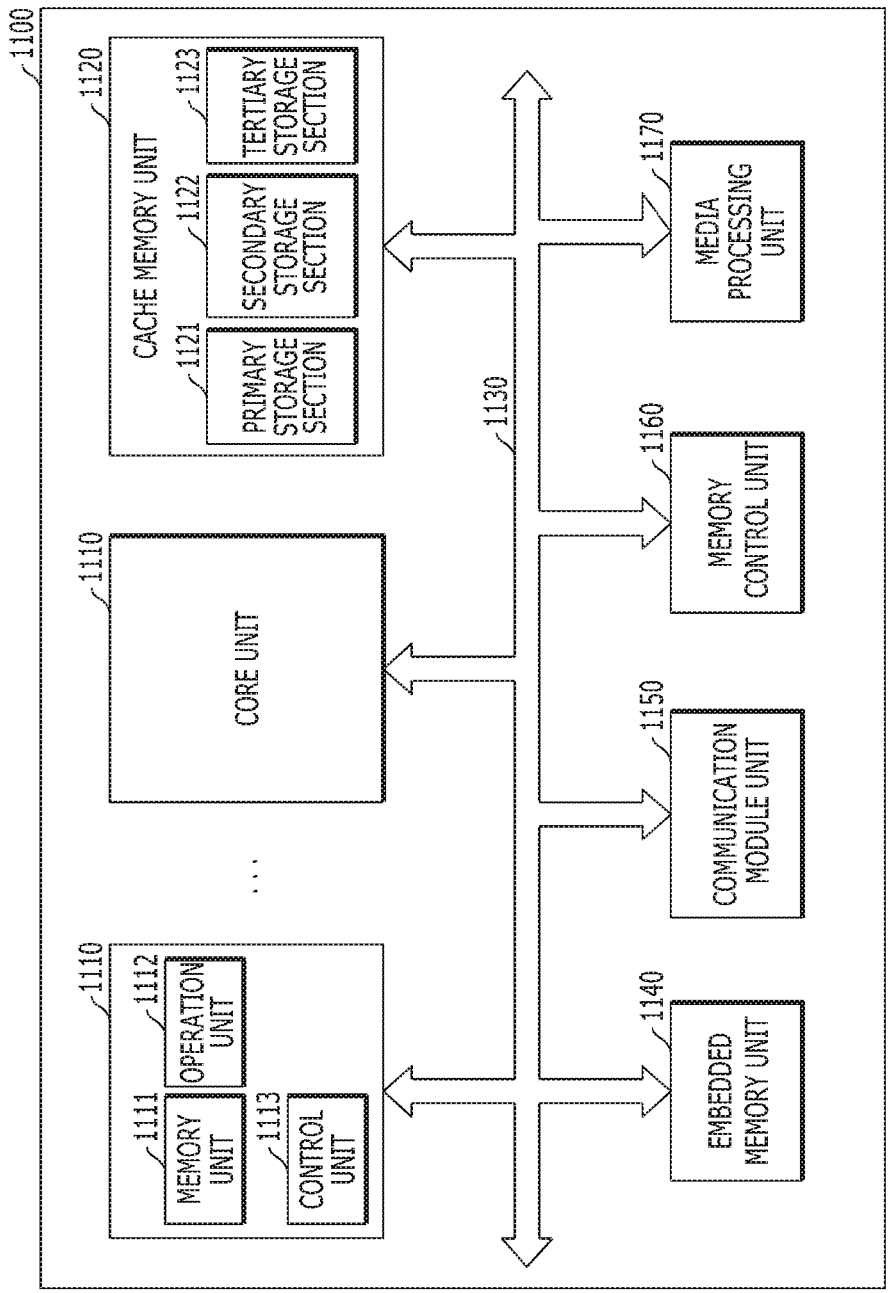
FIG. 11 is an example configuration diagram of a processor including memory circuitry based on an embodiment of the disclosed technology.

FIG. 11 is an example configuration diagram of a processor including memory circuitry based on an embodiment of the disclosed technology.

Referring to FIG. 11, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to store data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of this embodiment is operable to perform arithmetic logic operations for data inputted from an external device, and may include a memory unit 1111, an operation unit 1112 and a control unit 1113.

The memory unit 1111 is operable to store data in the processor 1100, as a processor register, a register or the like. The memory unit 1111 may include a data register, an address register, a floating point register and the like. Additionally, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is configured to perform operations in the processor 1100. The operation unit 1112 may perform four arithmetical operations, logical operations, according to results from the control unit 1113 decoding commands, or the like. The operation unit 1112 may include at least one arithmetic logic unit (ALU) and the like. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is operable to temporarily store data to compensate for a difference in data processing speed between the core unit 1110 operating at a high speed and an external device operating at a low speed. The cache memory unit 1120 may include a primary storage section 1121, a secondary storage section 1122, and a tertiary storage section 1123. In general, the cache memory unit 1120 includes the primary and secondary storage sections 1121 and 1122, and may include the tertiary storage section 1123 in the case where high storage capacity is required. When necessary, the cache memory unit 1120 may include an increased number of storage sections. That is, the number of storage sections which are included in the cache memory unit 1120 may be changed according to a design. The speeds at which the primary, secondary, and tertiary storage sections 1121, 1122 and 1123 store and discriminate data may be the same or different. In the case where the speeds of the respective storage sections 1121, 1122 and 1123 are different, the speed of the primary storage section 1121 may be greatest. At least one storage section of the primary storage section 1121, the secondary storage section 1122, and the tertiary storage section 1123 of the cache memory unit 1120 may include one or more of the above-described semiconductor devices based on the embodiments of the present invention. For example, the cache memory unit 1120 may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer, and a thermal stability enhanced layer (TSEL) including a homogeneous material having an Fe—O bond. Through this, data storage characteristics of the cache memory unit 1120 may be improved. As a consequence, operating characteristics of the processor 1100 may be improved.

Although it is shown in FIG. 11 that all the primary, secondary, and tertiary storage sections 1121, 1122 and 1123 are configured inside the cache memory unit 1120, it is to be noted that all or some of the primary, secondary, and tertiary storage sections 1121, 1122 and 1123 of the cache memory unit 1120 may be configured outside the core unit 1110, and may compensate for a difference in data processing speed between the core unit 1110 and the external device. Furthermore, it is noted that the primary storage section 1121 of the cache memory unit 1120 may be disposed inside the core unit 1110, and the secondary storage section 1122 and the tertiary storage section 1123 may be configured outside the core unit 1110 to strengthen the function of compensating for a difference in data processing speed. In another embodiment, the primary and secondary storage sections 1121, 1122 may be disposed inside the core unit 1110, and tertiary storage sections 1123 may be disposed outside core unit 1110.

The bus interface 1130 is operable to connect the core unit 1110, the cache memory unit 1120 and external device, and allows data to be efficiently transmitted.

The processor 1100 according to this embodiment may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core units 1110, the primary storage section 1121 of the cache memory unit 1120 may be configured in each core unit 1110 corresponding to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be greater than the processing speeds of the secondary and tertiary storage section 1122 and 1123. In another embodiment, the primary storage section 1121 and the secondary storage section 1122 may be configured in each core unit 1110 corresponding to the number of the plurality of core units 1110, and the tertiary storage section 1123 may be configured outside the plurality of core units 1110 in such a way as to be shared through the bus interface 1130.

The processor 1100 according to this embodiment may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and the like. The processor 1100 may include a plurality of various modules and devices. In this case, the plurality of modules which are added may exchange data with the core unit 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to the above mentioned memories, and the like. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), or a memory with similar functions.

The communication module unit 1150 may include a module capable of being connected with a wired network, a module capable of being connected with a wireless network or a combination of both. The wired network module may include a local area network (LAN), a universal serial bus (USB), an Ethernet, power line communication (PLC) such as various devices which send and receive data through transmit lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and the like.

The memory control unit 1160 administrates and processes data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The media processing unit 1170 may process the data processed in the processor 1100 or the data inputted in the forms of image, voice and other types from the external input device and output the data to the external interface device. The media processing unit 1170 may include a graphic processing unit (GPU), a digital signal processor (DSP), a high definition audio device (HD audio), a high definition multimedia interface (HDMI) controller, and the like.

Figure 12:
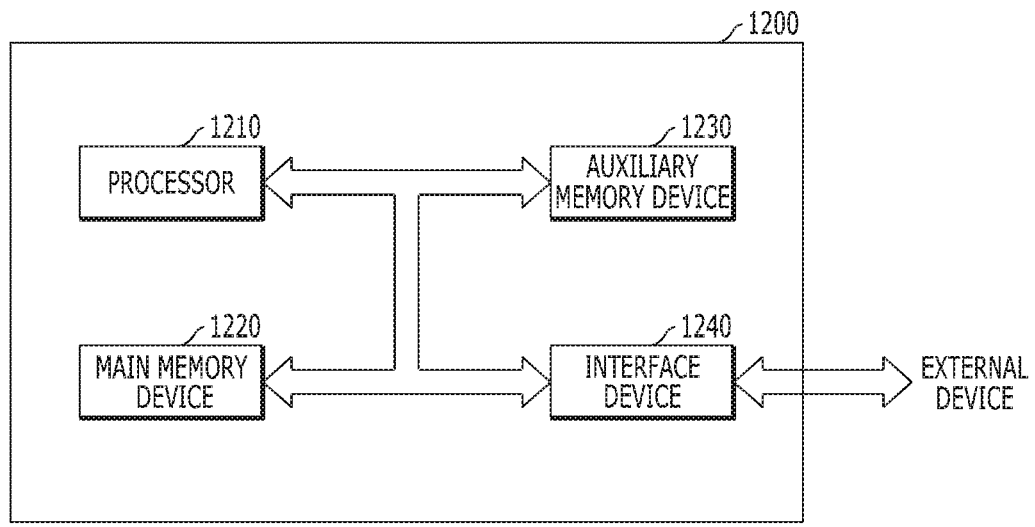
FIG. 12 is an example configuration diagram of a system including memory circuitry based on an embodiment of the disclosed technology.

FIG. 12 is an example configuration diagram of a system 1200 including memory circuitry based on an embodiment of the disclosed technology.

Referring to FIG. 12, the system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and the like. The system 1200 of this embodiment may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and the like.

The processor 1210 may decode inputted commands, process operations, (e.g., comparisons, etc.) for the data stored in the system 1200, and may control these operations. The processor 1210 may include a microprocessor unit (MPU), a central processing unit (CPU), a single/multi-core processor, a graphic processing unit (GPU), an application processor (AP), a digital signal processor (DSP), and the like.

The main memory device 1220 is a storage which can temporarily store, call, and execute program codes or data from the auxiliary memory device 1230 when programs are executed and can conserve memorized contents even when power supply is cut off. The main memory device 1220 may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer, and a thermal stability enhanced layer (TSEL) including a homogeneous material having an Fe—O bond. Through this, data storage characteristics of the main memory device 1220 may be improved. As a consequence, operating characteristics of the system 1200 may be improved.

Also, the main memory device 1220 may further include a static random-access memory (SRAM), a dynamic random-access memory (DRAM), and the like, of a volatile memory type in which all contents are erased when power supply is cut off. Unlike this, the main memory device 1220 may not include the semiconductor devices according to the embodiments, but may include a static random access memory (SRAM), a dynamic random access memory (DRAM), and the like, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices based on the embodiments. For example, the auxiliary memory device 1230 may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer, and a thermal stability enhanced layer (TSEL) including a homogeneous material having an Fe—O bond. Through this, data storage characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like. Unlike this, the auxiliary memory device 1230 may not include the semiconductor devices according to the embodiments, but may include data storage systems (see the reference numeral 1300 of FIG. 13) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The interface device 1240 may perform exchange of commands and data between the system 1200 and an external device. The interface device 1240 may be a keypad, a keyboard, a mouse, a speaker, a microphone, a display, various human interface devices (HIDs), a communication device, and the like. The communication device may include a module capable of being connected with a wired network, a module capable of being connected with a wireless network, or both. The wired network module may include a local area network (LAN), a universal serial bus (USB), an Ethernet, power line communication (PLC), such as various devices which send and receive data through transmission lines, and the like. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra-wideband (UWB), such as various devices which send and receive data without transmission lines, and the like.

Figure 13:
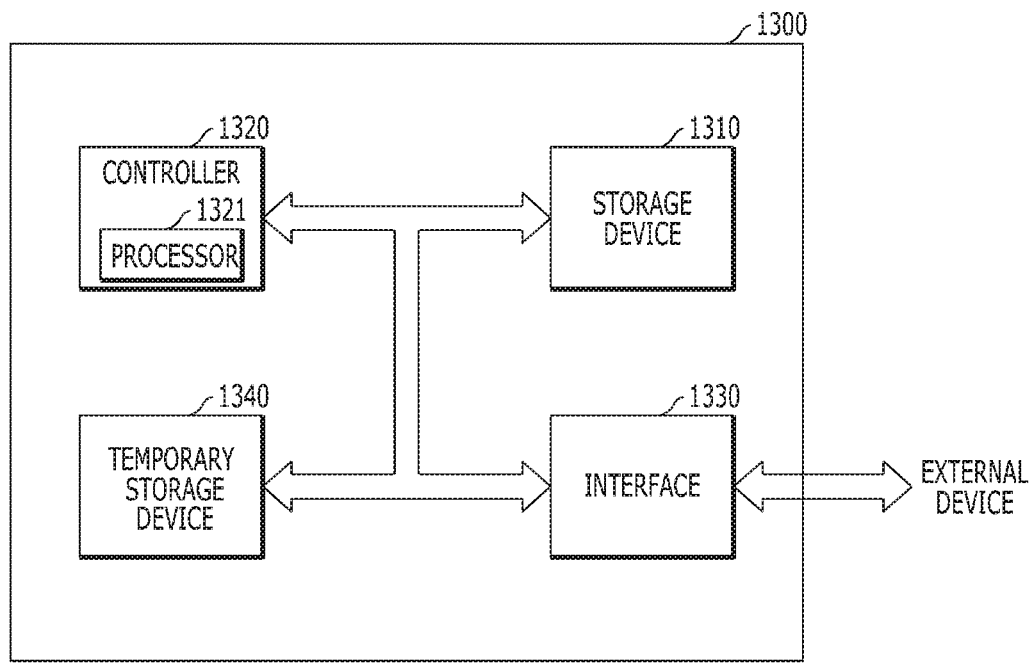
FIG. 13 is an example configuration diagram of a data storage system including memory circuitry based on an embodiment of the disclosed technology.

FIG. 13 is an example configuration diagram of a data storage system 1300 including memory circuitry based on an embodiment of the disclosed technology.

Referring to FIG. 13, the data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and the like, and a card type such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random-access memory (RRAM), a magnetic random-access memory (MRAM), and the like.

The controller 1320 may control exchange of data between the storage device 1310 and the interface 1330. To this end, the controller 1320 may include a processor 1321 for performing an operation for processing commands inputted through the interface 1330 from an outside of the data storage system 1300 and the like.

The interface 1330 performs exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and the like, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices based on the embodiments. The temporary storage device 1340 may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer, and a thermal stability enhanced layer (TSEL) including a homogeneous material having an Fe—O bond. Through this, data storage characteristics of the storage device 1310 or the temporary storage device 1340 may be improved. As a result, operating characteristics and data storage characteristics of the data storage system 1300 may be improved.

Figure 14:
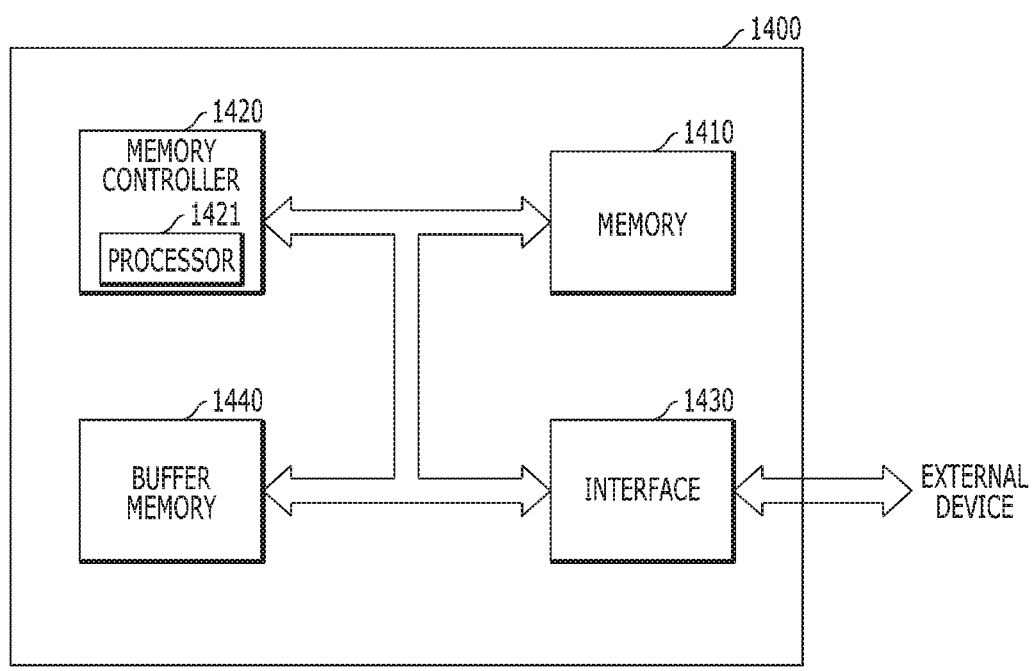
FIG. 14 is an example configuration diagram of a memory system including memory circuitry based on an embodiment of the disclosed technology.

FIG. 14 is an example configuration diagram of a memory system 1400 including memory circuitry based on an embodiment of the disclosed technology.

Referring to FIG. 14, the memory system 1400 may include a memory 1410 which has a nonvolatile characteristic as a component for storing data, a memory controller 1420 which controls the memory 1410, an interface 1430 for connection with an external device, and the like. The memory system 1400 may be a card type such as a solid state disk (SSD), a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like.

The memory 1410 for storing data may include one or more of the above-described semiconductor devices based on the embodiments. For example, the memory 1410 may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and a thermal stability enhanced layer (TSEL) including a homogeneous material having an Fe—O bond. Through this, data storage characteristics of the memory 1410 may be improved. As a consequence, operating characteristics and data storage characteristics of the memory system 1400 may be improved.

Also, the memory 1410 according to this embodiment may further include a ROM (read only memory), a NOR flash memory, a NAND flash memory, a phase change random access memory (PRAM), a resistive random access memory (RRAM), a magnetic random access memory (MRAM), and the like, which have a nonvolatile characteristic.

The memory controller 1420 may control the exchange of data between the memory 1410 and the interface 1430. To this end, the memory controller 1420 may include a processor 1421 for performing an operation for and processing commands inputted through the interface 1430 from an outside of the memory system 1400.

The interface 1430 may perform exchange of commands and data between the memory system 1400 and the external device. The interface 1430 may be compatible with interfaces which are used in devices, such as a USB memory (universal serial bus memory), a secure digital (SD) card, a mini secure digital (MSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and the like, or be compatible with interfaces which are used in devices similar to the above mentioned devices. The interface 1430 may be compatible with one or more interfaces having a different type from each other.

The memory system 1400 according to this embodiment may further include a buffer memory 1440 for efficiently transferring data between the interface 1430 and the memory 1410 according to diversification and high performance of an interface with an external device, a memory controller, and a memory system. For example, the buffer memory 1440 for temporarily storing data may include one or more of the above-described semiconductor devices based on the embodiments. The buffer memory 1440 may include a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer, and a thermal stability enhanced layer (TSEL) including a homogeneous material having an Fe—O bond. Through this, data storage characteristics of the buffer memory 1440 may be improved. As a consequence, operating characteristics and data storage characteristics of the memory system 1400 may be improved.

Moreover, the buffer memory 1440 according to this embodiment may further include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic. Unlike this, the buffer memory 1440 may not include the semiconductor devices according to the embodiments, but may include an SRAM (static random access memory), a DRAM (dynamic random access memory), and the like, which have a volatile characteristic, and a phase change random access memory (PRAM), a resistive random access memory (RRAM), a spin transfer torque random access memory (STTRAM), a magnetic random access memory (MRAM), and the like, which have a nonvolatile characteristic.

Features in the above examples of electronic devices or systems in FIGS. 10-14 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few embodiments and examples are described. Other embodiments, enhancements and variations can be made based on what is described and illustrated in this patent document.

While the present invention has been described with respect to specific embodiments, it will be apparent to those skilled in the art that various changes and modifications may be made without departing from the spirit and scope of the invention as defined in the following claims.

What is claimed is:

1. An electronic device comprising a semiconductor memory, wherein the semiconductor memory includes:
   a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and
   a thermal stability enhanced layer (TSEL) including a homogeneous material having an Fe—O bond,
   wherein the semiconductor memory includes a synthetic antiferromagnet (SAF) structure disposed over the tunnel barrier layer and the TSEL is disposed under the free layer.

2. An electronic device comprising a semiconductor memory, wherein the semiconductor memory includes:
   a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and
   a thermal stability enhanced layer (TSEL) including a homogeneous material having an Fe—O bond,
   wherein the semiconductor memory includes a synthetic antiferromagnet (SAF) structure disposed under the tunnel barrier layer and the TSEL is disposed over the free layer.

3. The electronic device of claim 1, wherein the TSEL includes an Fe—O—X alloy and X includes Co, B, Mn, Cu, Al, Si, Ti, V, Cr, Ni, Ga, Ge, Zr, Nb, Mo, Pd, Ag, Hf, Ta, Ru, Pt, Rh, Ir, Mg, Sr, Ba, or a combination thereof.

4. An electronic device comprising a semiconductor memory, wherein the semiconductor memory includes:
   a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and
   a thermal stability enhanced layer (TSEL) including a homogeneous material having an Fe—O bond,
   wherein the TSEL includes an Fe—Ir—O—X alloy and X includes Co, B, Mn, Cu, Al, Si, Ti, V, Cr, Ni, Ga, Ge, Zr, Nb, Mo, Pd, Ag, Hf, Ta, Ru, Pt, Rh, Mg, Sr, Ba, or a combination thereof.

5. An electronic device comprising a semiconductor memory, wherein the semiconductor memory includes:
   a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and a thermal stability enhanced layer (TSEL) including a homogeneous material having an Fe—O bond, wherein the semiconductor memory further includes an intermediate layer having a body centered cubic (001) structure and interposed between the tunnel barrier layer and the pinned layer.

6. The electronic device of claim 5, wherein the intermediate layer includes Co, Fe, Ni, B, a noble metal, or a combination thereof.

7. An electronic device comprising a semiconductor memory, wherein the semiconductor memory includes:

a magnetic tunnel junction (MTJ) structure including a free layer, a pinned layer, and a tunnel barrier layer, the free layer having a variable magnetization direction, the pinned layer having a fixed magnetization direction, the tunnel barrier layer being interposed between the free layer and the pinned layer; and a thermal stability enhanced layer (TSEL) including a homogeneous material having an Fe—O bond, wherein the semiconductor memory further includes:

a shift canceling layer having a magnetization direction anti-parallel to the pinned layer; and a spacer layer interposed between the pinned layer and the shift canceling layer, wherein the pinned layer and the shift canceling layer form an antiferromagnetic exchange coupling through the spacer layer to form a synthetic antiferromagnet (SAF) structure.

8. An electronic device comprising a semiconductor memory, wherein the semiconductor memory comprises:

a substrate;

memory cells formed over the substrate, each memory cell including a magnetic layer and a thermal stability enhanced layer (TSEL) that is in contact with the magnetic layer; and switching elements formed over the substrate and coupled to the memory cells, respectively, to select or de-select the memory cells, wherein the TSEL includes a homogenous material having an Fe—O bond and structured to enhance a perpendicular magnetic anisotropy field.

9. The electronic device of claim 8, wherein each memory cell includes:

a free layer having a variable magnetization direction;

a pinned layer having a fixed magnetization direction;

a tunnel barrier layer being interposed between the free layer and the pinned layer;

a shift canceling layer having a magnetization direction anti-parallel to the pinned layer; and a spacer layer interposed between the pinned layer and the shift canceling layer, wherein the pinned layer and the shift canceling layer form an antiferromagnetic exchange coupling through the spacer layer to form a synthetic antiferromagnet (SAF) structure.

10. The electronic device of claim 9, wherein the SAF structure is disposed over the tunnel barrier layer and the TSEL is disposed under the free layer.

11. The electronic device of claim 9, wherein the SAF structure is disposed under the tunnel barrier layer and the TSEL is disposed over the free layer.

12. The electronic device of claim 8, wherein the TSEL includes an Fe—O—X alloy and X includes Co, B, Mn, Cu, Al, Si, Ti, V, Cr, Ni, Ga, Ge, Zr, Nb, Mo, Pd, Ag, Hf, Ta, Ru, Pt, Rh, Jr, Mg, Sr, Ba, or a combination thereof.

13. The electronic device of claim 8, wherein the TSEL includes an Fe—Ir—O—X alloy and X includes Co, B, Mn, Cu, Al, Si, Ti, V, Cr, Ni, Ga, Ge, Zr, Nb, Mo, Pd, Ag, Hf, Ta, Ru, Pt, Rh, Mg, Sr, Ba, or a combination thereof.

14. The electronic device of claim 9, wherein each memory cell further includes an intermediate layer that includes a material that has a body centered cubic (001) structure and is interposed between the tunnel barrier layer and the pinned layer.

15. The electronic device of claim 14, wherein the intermediate layer includes Co, Fe, Ni, B, a noble metal, or a combination thereof.

16. The electronic device of claim 8, wherein each memory cell further includes a capping layer having a multilayer structure, and wherein each layer included in the multilayer has different materials from each other.

17. The electronic device of claim 2, wherein the TSEL includes an Fe—O—X alloy and X includes Co, B, Mn, Cu, Al, Si, Ti, V, Cr, Ni, Ga, Ge, Zr, Nb, Mo, Pd, Ag, Hf, Ta, Ru, Pt, Rh, Ir, Mg, Sr, Ba, or a combination thereof.

* * * * *